United States Patent
Ehrlich et al.

(10) Patent No.: US 9,536,619 B2
(45) Date of Patent: Jan. 3, 2017

(54) HYBRID-HDD WITH IMPROVED DATA RETENTION

(71) Applicant: KABUSHIKI KAISHA TOSHIBA, Tokyo (JP)

(72) Inventors: Richard M. Ehrlich, Saratoga, CA (US); Eric R. Dunn, Cupertino, CA (US); Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/723,087

(22) Filed: May 27, 2015

(65) Prior Publication Data

US 2016/0351270 A1    Dec. 1, 2016

(51) Int. Cl.

| G11C 16/04 | (2006.01) |
|---|---|
| G11C 16/34 | (2006.01) |
| G11C 16/16 | (2006.01) |
| G11C 16/26 | (2006.01) |
| G11C 29/08 | (2006.01) |

(52) U.S. Cl.
CPC ........... G11C 16/3418 (2013.01); G11C 16/16 (2013.01); G11C 16/26 (2013.01); G11C 16/3459 (2013.01); G11C 29/08 (2013.01)

(58) Field of Classification Search
CPC ..... G11C 16/3418; G11C 16/16; G11C 16/26; G11C 16/3459; G11C 29/08
USPC ................. 365/185.11, 185.1, 233.1
See application file for complete search history.

(56) References Cited

U.S. PATENT DOCUMENTS

| 7,233,890 B2 * | 6/2007 | Shapiro ................. G06F 9/4415 703/13 |
|---|---|---|
| 7,269,755 B2 * | 9/2007 | Moshayedi ......... G06F 11/1441 714/2 |
| 7,447,944 B2 | 11/2008 | Hu |
| 7,554,855 B2 * | 6/2009 | Kim ................... G11C 14/0018 365/185.11 |
| 8,072,163 B2 * | 12/2011 | Roberts .............. H05B 33/0893 315/169.1 |
| 8,144,515 B2 * | 3/2012 | Moshayedi ......... G06F 12/0607 365/185.11 |
| 8,164,967 B2 | 4/2012 | Byom et al. |
| 8,456,938 B2 | 6/2013 | Byom et al. |
| 8,645,776 B2 | 2/2014 | Byom et al. |
| 8,650,446 B2 | 2/2014 | Byom et al. |
| 2011/0302445 A1 | 12/2011 | Byom et al. |
| 2013/0290617 A1 | 10/2013 | Veneroso et al. |

* cited by examiner

*Primary Examiner* — Pho M Luu
(74) *Attorney, Agent, or Firm* — Patterson & Sheridan, LLP (57) ABSTRACT

Data are refreshed in a nonvolatile solid-state device to significantly reduce the likelihood of data retention errors. Test data are written in a region of the nonvolatile solid-state device when user data are stored in the nonvolatile solid-state device, and are subsequently read to detect the possibility of data retention errors occurring when the associated user data are read. The test data may be a portion of the user data or a predetermined test pattern. To increase sensitivity to incipient charge leakage that may compromise the user data, the test data may be written using a modified write process and/or read with a modified read operation. The nonvolatile solid-state device may be employed as part of a solid-state drive or as the flash-memory portion of a hybrid hard disk drive.

22 Claims, 11 Drawing Sheets

HYBRID-HDD WITH IMPROVED DATA RETENTION

BACKGROUND

Hybrid hard disk drive (HDD) storage devices include one or more rotating magnetic disks combined with non-volatile solid-state memory. Generally, the nonvolatile solid-state memory includes NAND-based memory cells that provide the ability to access data as quickly as a solid-state drive, while the magnetic disks provide the data storage capacity of a conventional HDD. For this reason hybrid HDDs are expected to be commonly used in laptop computers.

However, one drawback of the NAND-based memory cells in solid-state drives and hybrid HDDs is that the data retention of such cells may be limited by charge leaking from the floating gates of the memory cell transistors. Charge leakage is accelerated by high temperatures and radiation, whose effects are difficult to track. Consequently, data retention time for a particular NAND memory cell is not a fixed, known time period. Instead, there is significant uncertainty in how long a NAND memory cell can reliably retain data. Additional factors compound this uncertainty, including the small manufacturing differences inherent in each NAND memory cell, the damage done to each memory cell by repeated Program-Erase cycles, and variations in the process of programming the data into each NAND cell. Thus, the improved performance provided to a hybrid HDD by NAND-based memory cells is partially offset by the fact that NAND memory cells have limited data retention capability and are inherently less reliable than other storage media in the hybrid HDD.

SUMMARY

One or more embodiments provide systems and methods for refreshing data in a nonvolatile solid-state device to significantly reduce the likelihood of data retention errors in the nonvolatile solid-state device. Specifically, test data are written in a region of the nonvolatile solid-state device when user data are stored in the nonvolatile solid-state device, and are subsequently read to detect the possibility of data retention errors that may occur when reading the associated user data. The test data may be a portion of the user data or a predetermined test pattern. Furthermore, to increase sensitivity to incipient charge leakage that may compromise the user data, the test data may be written using a modified write process and/or read with a modified read operation. The nonvolatile solid-state device may be employed as part of a solid-state drive or as the flash-memory portion of a hybrid hard disk drive.

A nonvolatile solid-state device, according to embodiments, includes a controller and a plurality of data storage regions including a first region that has written therein first test data and first user data and a second region that has written therein second test data and second user data. In one embodiment, the controller is configured to determine that a quality of the first test data exceeds a threshold and a quality of the second test data is below the threshold, in response to the first test data exceeding the threshold, maintain the first user data in the first block, in response to the first test data exceeding the threshold, rewriting the second user data in a third region of the non-volatile solid-state device, and after rewriting the second user data in the third region, indicating that the second block is available for reuse.

A method of refreshing data, according to an embodiment, is carried out in a non-volatile solid-state device divided into a plurality of regions including a first region that has written therein first test data and first user data and a second region that has written therein second test data and second user data. The method includes determining that a quality of the first test data exceeds a threshold and a quality of the second test data is below the threshold, maintaining the first user data in the first block, rewriting the second user data in a third region of the non-volatile solid-state device, and, after rewriting the second user data in the third region, indicating that the second block is available for reuse.

DETAILED DESCRIPTION

Figure 1:
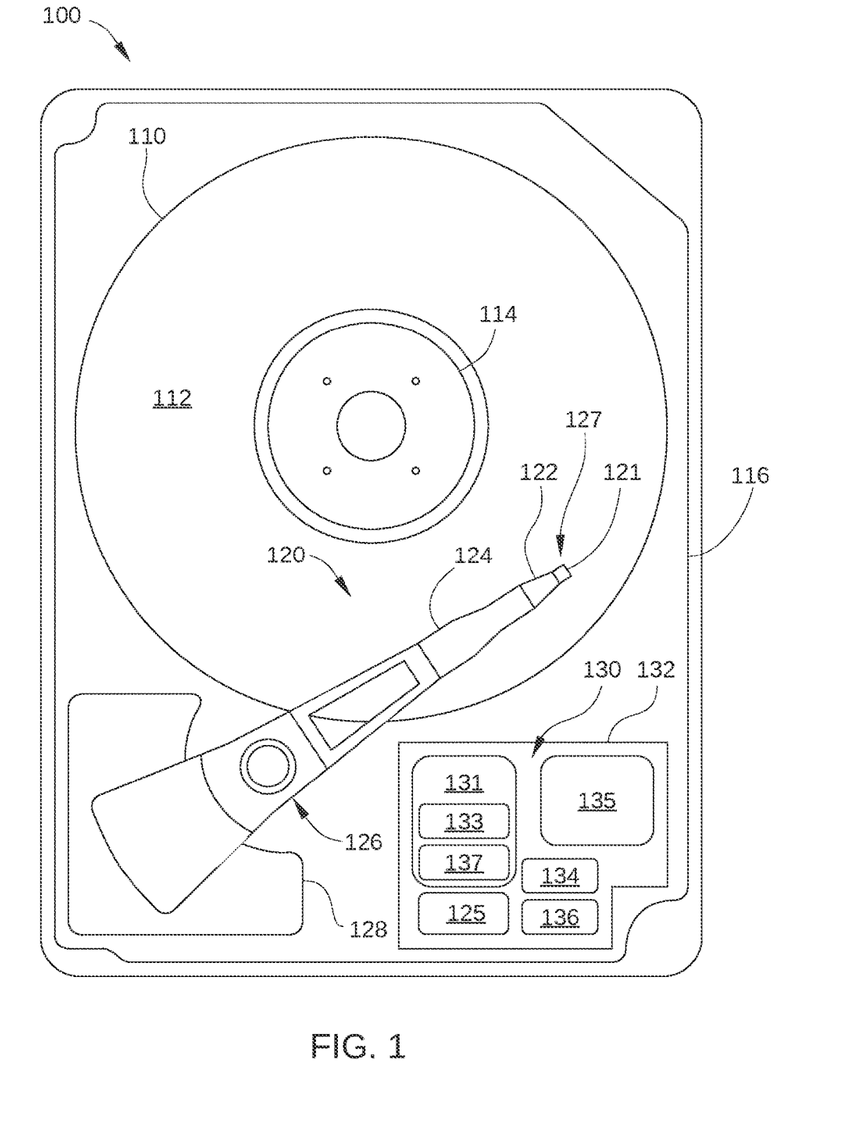
FIG. 1 is a schematic view of an exemplary hybrid hard disk drive (HDD), according to one embodiment.

FIG. 1 is a schematic view of an exemplary hybrid disk drive (HDD) 100, according to one embodiment. For clarity, hybrid HDD 100 is illustrated without a top cover. Hybrid HDD 100 includes at least one storage disk 110 that is rotated by a spindle motor 114 and includes a plurality of concentric data storage tracks. Spindle motor 114 is mounted on a base 116. An actuator arm assembly 120 is also mounted on base 116, and has a slider 121 mounted on a flexure arm 122 with a read/write head 127 that reads data from and writes data to the data storage tracks. Flexure arm 122 is attached to an actuator arm 124 that rotates about a bearing assembly 126. Voice coil motor 128 moves slider 121 relative to storage disk 110, thereby positioning read/write head 127 over the desired concentric data storage track disposed on the surface 112 of storage disk 110. Spindle motor 114, read/write head 127, and voice coil motor 128 are controlled by electronic circuits 130, which are mounted on a printed circuit board 132. Electronic circuits 130 include a read/write channel 137, a microprocessor-based controller 133, random-access memory (RAM) 134 (which may be a dynamic RAM and is used as a data buffer), and a flash memory device 135 and flash manager device 136. In some embodiments, read/write channel 137 and microprocessor-based controller 133 are included in a single chip, such as a system-on-chip 131. In some embodiments, hybrid HDD 100 may further include a motor-driver chip 125, which accepts commands from microprocessor-based controller 133 and drives both spindle motor 114 and voice coil motor 128. The read/write channel 137 communicates with the read/write head 127 via a preamplifier (not shown) that may be mounted on a flex-cable that is itself mounted on either the base 116, or the actuator arm 120 or both.

For clarity, hybrid HDD 100 is illustrated with a single storage disk 110 and a single actuator arm assembly 120. Hybrid HDD 100 may also include multiple storage disks similar to storage disk 110 and multiple actuator arm assemblies similar to actuator arm assembly 120. In addition, each side of storage disk 110 may have an associated read/write head similar to read/write head 127 coupled to a flexure arm similar to flexure arm 122.

When data are transferred to or from storage disk 110, actuator arm assembly 120 sweeps an arc between an inner diameter (ID) and an outer diameter (OD) of storage disk 110. Actuator arm assembly 120 accelerates in one angular direction when current is passed in one direction through the voice coil of voice coil motor 128 and accelerates in an opposite direction when the current is reversed, thereby allowing control of the position of actuator arm assembly 120 and attached read/write head 127 with respect to storage disk 110. Voice coil motor 128 is coupled with a servo system known in the art that uses the positioning data read from servo wedges on storage disk 110 by read/write head 127 to determine the position of read/write head 127 over a specific data storage track. The servo system determines an appropriate current to drive through the voice coil of voice coil motor 128, and drives said current using a current driver and associated circuitry.

Hybrid HDD 100 is configured as a hybrid HDD, in which nonvolatile data storage may be performed using storage disk 110 and/or flash memory device 135. In a hybrid HDD, nonvolatile memory, such as flash memory device 135, supplements the spinning storage disk 110 to provide faster boot, hibernate, resume and other data read-write operations, as well as lower power consumption. Such a hybrid HDD configuration is particularly advantageous for battery-operated computer systems, such as mobile computers or other mobile computing devices. In a preferred embodiment, flash memory device 135 is a nonvolatile storage medium, such as a NAND flash chip, that can be electrically erased and reprogrammed, and is sized to supplement storage disk 110 in hybrid HDD 100 as a nonvolatile solid-state storage medium. For example, in some embodiments, flash memory device 135 has data storage capacity that is orders of magnitude larger than RAM 134, e.g., gigabytes (GB) vs. megabytes (MB).

Figure 2:
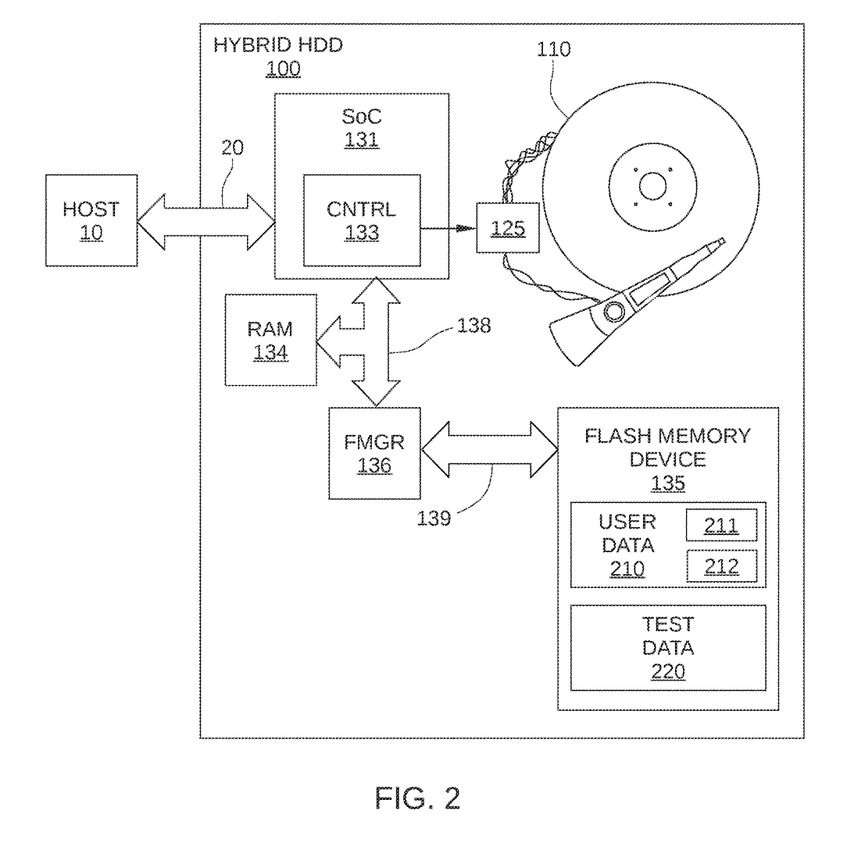
FIG. 2 illustrates an operational diagram of the hybrid HDD of FIG. 1 with elements of electronic circuits shown configured according to one embodiment.

FIG. 2 illustrates an operational diagram of hybrid HDD 100 with elements of electronic circuits 130 shown configured according to one embodiment. As shown, hybrid HDD 100 includes RAM 134, flash memory device 135, a flash manager device 136, system-on-chip 131, and storage disk 110. Hybrid HDD 100 is connected to a host 10, such as a host computer, via a host interface 20, such as a serial advanced technology attachment (SATA) bus or a serial attached SCSI (SAS) bus.

In the embodiment illustrated in FIG. 2, flash manager device 136 controls interfacing of flash memory device 135 with a high-speed data path 138 and is connected to flash memory device 135 via a NAND interface bus 139. System-on-chip 131 includes microprocessor-based controller 133 and other hardware (including read/write channel 137) for controlling operation of hybrid HDD 100, and is connected to RAM 134 and flash manager device 136 via high-speed data path 138. Microprocessor-based controller 133 is a control unit that may include one or more microcontrollers, such as ARM microprocessors, a hybrid HDD controller, and any control circuitry within hybrid HDD 100. High-speed data path 138 is a high-speed bus known in the art, such as a double data rate (DDR) bus, a DDR2 bus, a DDR3 bus, or the like. In other embodiments, hybrid HDD 100 may be configured with different data interfaces and buses than those illustrated in FIG. 2. In particular, the controller 133 may communicate with the RAM 134 and the flash manager device 136 via separate high-speed data paths.

Flash memory device 135 is configured to store user data 210 and test data 220. Although user data 210 is depicted in FIG. 2 as a single region of flash memory device 135, in practice there is typically a plurality of instances of user data 210 in flash memory device 135, and these multiple instances are not necessarily contiguous with or otherwise adjacent to each other. Similarly, there are typically multiple instances of test data 220 in flash memory device 135 that are not necessarily contiguous with or adjacent to each other.

User data 210 include data that are stored by HDD 100 and associated with one or more hosts 10. In some embodiments, user data 210 include data associated with write commands (referred to herein as "write data") received by hybrid HDD 100 from host 10. In such embodiments, user data 210 may be stored in flash memory device 135 until copied onto storage disk 110. During the time interval in which a particular set of write data is stored in flash memory device 135 as user data 210 but has not been stored on storage disk 110, the set of write data are categorized as "dirty data" 211. In the context of a hybrid disk drive, dirty data 211 include data that are stored in flash memory device 135 and for which there is no up-to-date copy also stored on storage disk 110. Since there is no copy of dirty data 211 stored on another nonvolatile data storage device, data retention errors that occur in flash memory device 135 can result in loss and/or corruption of dirty data 211. After a copy of write data received from host 10 is also stored on storage disk 110, the write data are categorized as "non-dirty data" 212, since storage disk 110 provides long-term nonvolatile storage of the write data. Thus, non-dirty data 212 include data for which a second current copy exists on storage disk 110.

In some embodiments, user data 210 includes data associated with read commands (referred to herein as "read data") received by hybrid HDD 100 from host 10. Thus, in such embodiments, user data 210 may include data used to populate a read cache for hybrid HDD 100. A read cache includes data that have been requested previously by host 10 (via one or more read commands) and read from a slower permanent storage location, e.g., storage disk 110. The read cache temporarily keeps a copy of such data in order to accelerate the fulfillment of future requests for that data. Therefore, by definition, the data in a read cache in flash memory device 135 is a second copy of data that are also stored on storage disk 110. As such, read data stored in flash memory device 135 are categorized as non-dirty data 212.

When user data 210 are initially written in a region of flash memory device 135, the data in each NAND memory cell has a bit value based on the value of the threshold of a field-effect transistor (FET) formed as part of the NAND memory cell. In the case of a single-level cell (SLC) NAND memory cell, the threshold of the FET is either negative (corresponding to an erased cell, or a bit-value of 1) or positive (corresponding to a programmed cell, or a bit-value of 0). Typically, immediately after a data pattern has been written to a group of such memory cells, the distribution of voltage thresholds of the group of memory cells is relatively narrow, but degrades over time. An example of this phenomenon is illustrated in FIG. 3.

Figure 3:
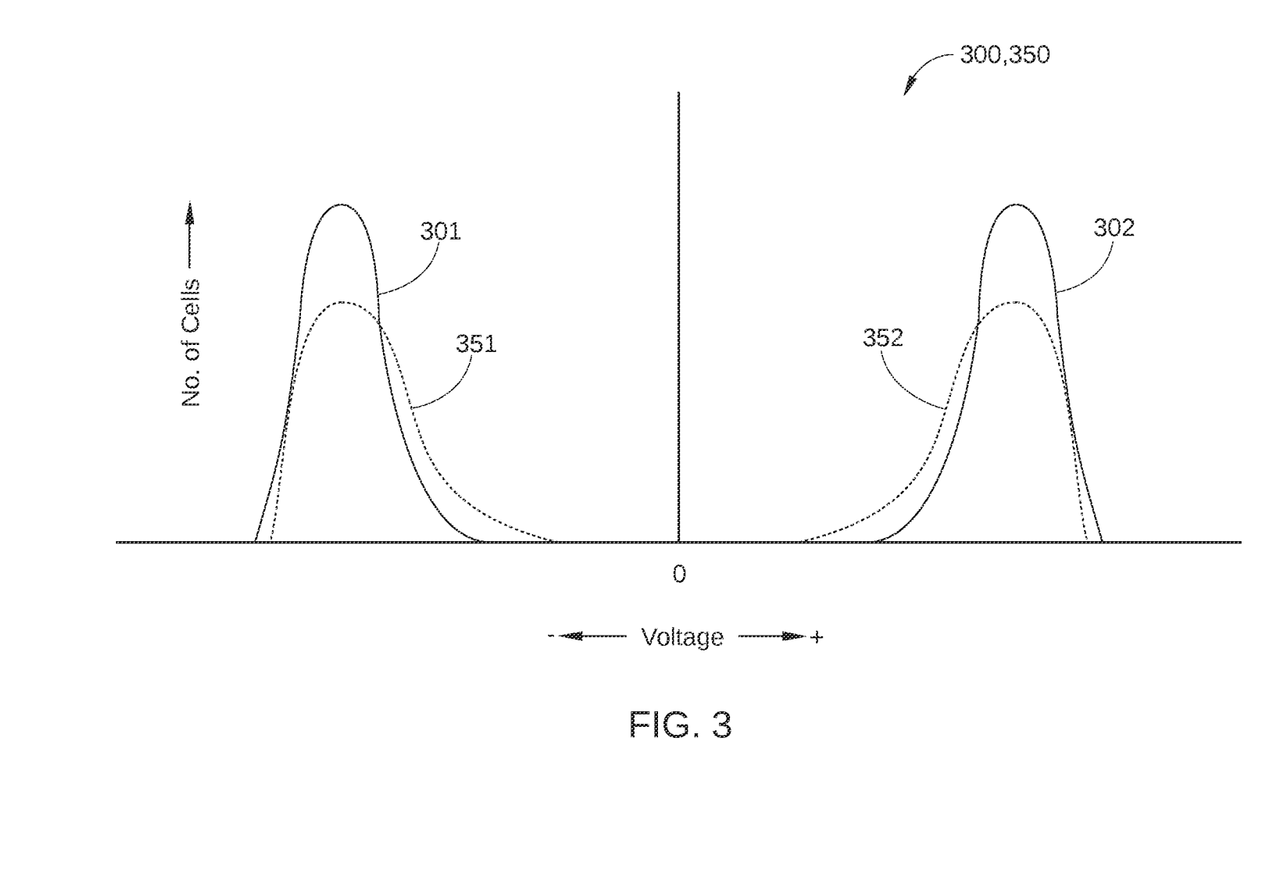
FIG. 3 is a graph illustrating an initial distribution of voltage thresholds for a group of NAND memory cells shortly after being programmed and a relaxed distribution of voltage thresholds for the same group of NAND memory cells after a significant time interval and/or exposure to elevated temperature.

FIG. 3 is a graph illustrating an initial distribution 300 of voltage thresholds for a group of NAND memory cells shortly after being programmed and a relaxed distribution 350 (dashed curves) of voltage thresholds for the same group of NAND memory cells after a significant time interval and/or exposure to elevated temperature. In FIG. 3, the abscissa represents threshold voltage of a NAND cell of the group of NAND cells, centered at 0 volts, and the ordinate represents a number of cells that have a particular threshold voltage value. Initial distribution 300 indicates the distribution of threshold voltage across the group of NAND memory cells after being programmed with a pattern of 0's (programmed cells) and 1's (cells that were allowed to stay erased) in flash memory device 135. Thus, initial distribution 300 includes an erased-cell voltage distribution 301 in the negative voltage region of initial distribution 300 and a programmed-cell voltage distribution 302 in the positive voltage region of initial distribution 300. Similarly, relaxed distribution 350 includes an erased-cell voltage distribution 351 in the negative voltage region of relaxed distribution 350 and a programmed-cell voltage distribution 352 in the positive voltage region of relaxed distribution 350.

Comparison of erased-cell voltage distribution 301 to erased-cell voltage distribution 351 graphically illustrates that the threshold voltage for erased bits in the group of NAND memory cells slowly degrades in the positive direction, i.e., toward a threshold of 0 volts. Similarly, comparison of programmed-cell voltage distribution 302 to programmed-cell voltage distribution 352 graphically illustrates that the threshold voltage for programmed bits in the group of NAND memory cells slowly degrades in the negative direction, i.e., toward a threshold of 0 volts. Eventually, after sufficient time and/or exposure to high temperature, a significant number of NAND memory cells programmed as 1's can have a voltage threshold that is greater than 0 volts, and therefore will be read as a 0 bit. Conversely, a significant number of NAND memory cells programmed as 0's can have a voltage threshold that is less than 0 volts, and therefore will be read as a 1 bit. Thus, after an indeterminate time interval, the group of NAND memory cells represented by initial distribution 300 may have prohibitively large numbers of read errors associated therewith, unless refreshed, i.e. rewritten, at a suitable time. According to some embodiments, data loss caused by the above-described degradation of the voltage distribution of NAND memory cells can be reduced or eliminated by writing test data 220 concurrently with or prior to writing user data 210, and then subsequently reading test data 220.

Test data 220 are data that are stored in flash memory device 135 when write data are received by hybrid HDD 100 and stored as user data 210. In some embodiments, test data 220 include a portion of the write data received by hybrid HDD 100, for example the first 32 KB of said write data, or any other portion of said write data. Alternatively or additionally, test data 220 may include a predetermined data test pattern. In some embodiments, the predetermined data test pattern is written in a region of flash memory device 135 with a modified write operation to facilitate subsequent detection of incipient charge leakage. For example, in such embodiments, the predetermined data test pattern is written with a write programming voltage that is less than a write programming voltage employed to write the user data 210 associated with test data 220. Alternatively or additionally, in such embodiments, the predetermined test pattern is written with a write period that is shorter than the write period used to write the user data 210 associated with test data 220. In either case, the NAND memory cells storing the predetermined data test pattern are not programmed as robustly as the NAND memory cells storing user data 210 associated with test data 220. Consequently, test data 220 can be expected to indicate data retention failure before the user data 210 associated therewith experiences data retention failure. One such embodiment is illustrated in FIG. 4.

Figure 4:
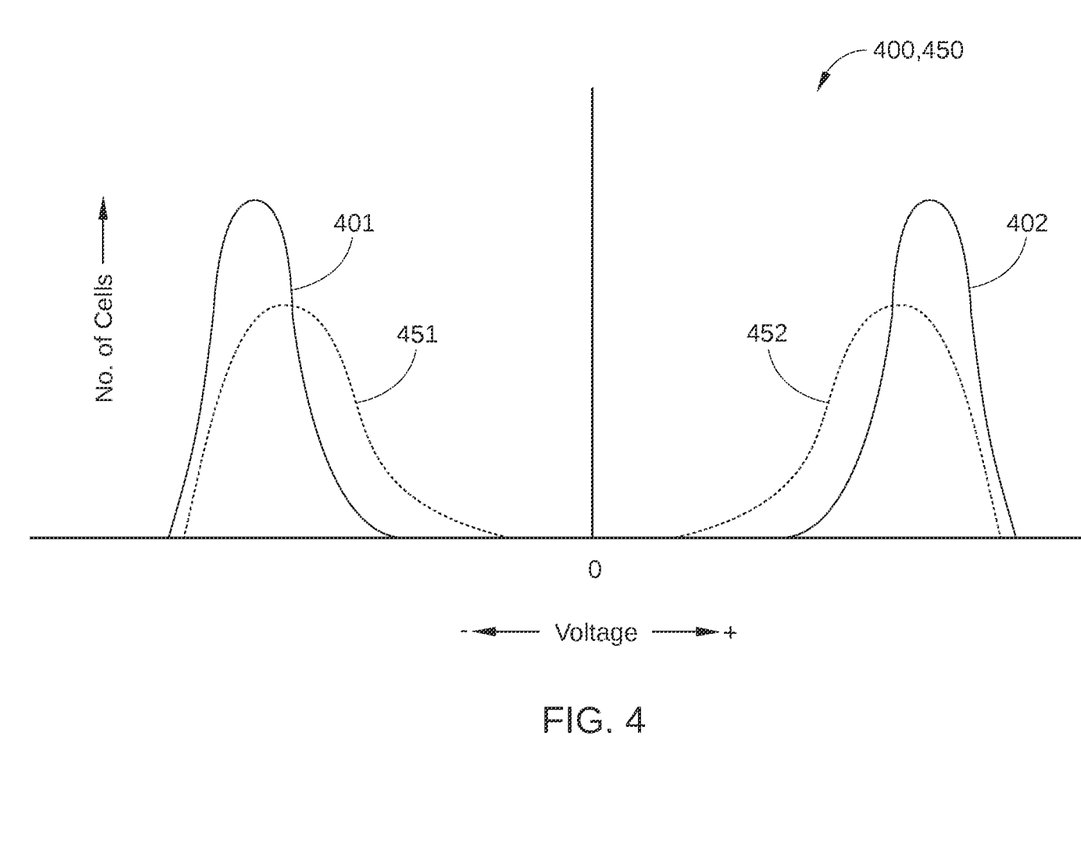
FIG. 4 is a graph illustrating a user data distribution of voltage thresholds for a group of NAND memory cells shortly after being programmed with user data and a test data distribution of voltage thresholds for a group of NAND memory cells shortly after being programmed with test data, according to an embodiment.

FIG. 4 is a graph illustrating a user data distribution 400 of voltage thresholds for a group of NAND memory cells shortly after being programmed with user data 210 and a test data distribution 450 (dashed curves) of voltage thresholds for a group of NAND memory cells shortly after being programmed with test data 220, according to an embodiment. In FIG. 4, the abscissa represents threshold voltage of a NAND cell storing either user data 210 or test data 220, and the ordinate represents a number of cells that have a particular threshold voltage value. User data distribution 400 includes an erased-cell voltage distribution 401 disposed in the negative voltage region of user data distribution 400 and a programmed-cell voltage distribution 402 disposed in the positive voltage region of user data distribution 400, while test data distribution 450 includes a similarly disposed erased-cell voltage distribution 451 and programmed-cell voltage distribution 452.

In the NAND memory cells represented by test data distribution 450, i.e., cells programmed with test data 220, a modified write operation is used to write test data 220. As described above, the modified write operation may be similar to a write operation employed for writing user data 210, except marginalized in some way, such as with a reduced write programming voltage or for a reduced write period. As shown, erased-cell threshold voltage distribution 451 is a significantly degraded distribution compared to erased-cell threshold voltage distribution 401, and programmed-cell threshold voltage distribution 452 is a significantly degraded distribution compared to programmed-cell threshold voltage distribution 402. It can be assumed that the NAND memory cells programmed with test data 220 are substantially similar to the NAND memory cells programmed with user data 210, and have experienced similar exposure to temperature and radiation and have been previously erased and programmed a similar number of times. Therefore, the NAND memory cells programmed with test data 220 can be determined to have data retention errors well before the NAND memory cells that are programmed with user data 210 lose data, since erased-cell threshold voltage distribution 451 and programmed-cell threshold voltage distribution 452 each begin with a significant number of NAND memory cells distributed closer to 0 volts than erased-cell threshold voltage distribution 401 and programmed-cell threshold voltage distribution 402, respectively.

In some embodiments, test data 220 are read using a modified read operation that is marginalized relative to the read operation employed for reading user data 210. Thus, the quality of test data 220 is measured in such embodiments by reading test data 220 using a read threshold that is selected to increase a likelihood of read errors occurring. In this way, test data 220 can indicate data retention errors before user data 210 have degraded to a point at which data loss can occur. For example, in some embodiments a modified read threshold is employed when reading test data 220 versus when reading user data 210. One such embodiment is illustrated in FIG. 5.

Figure 5:
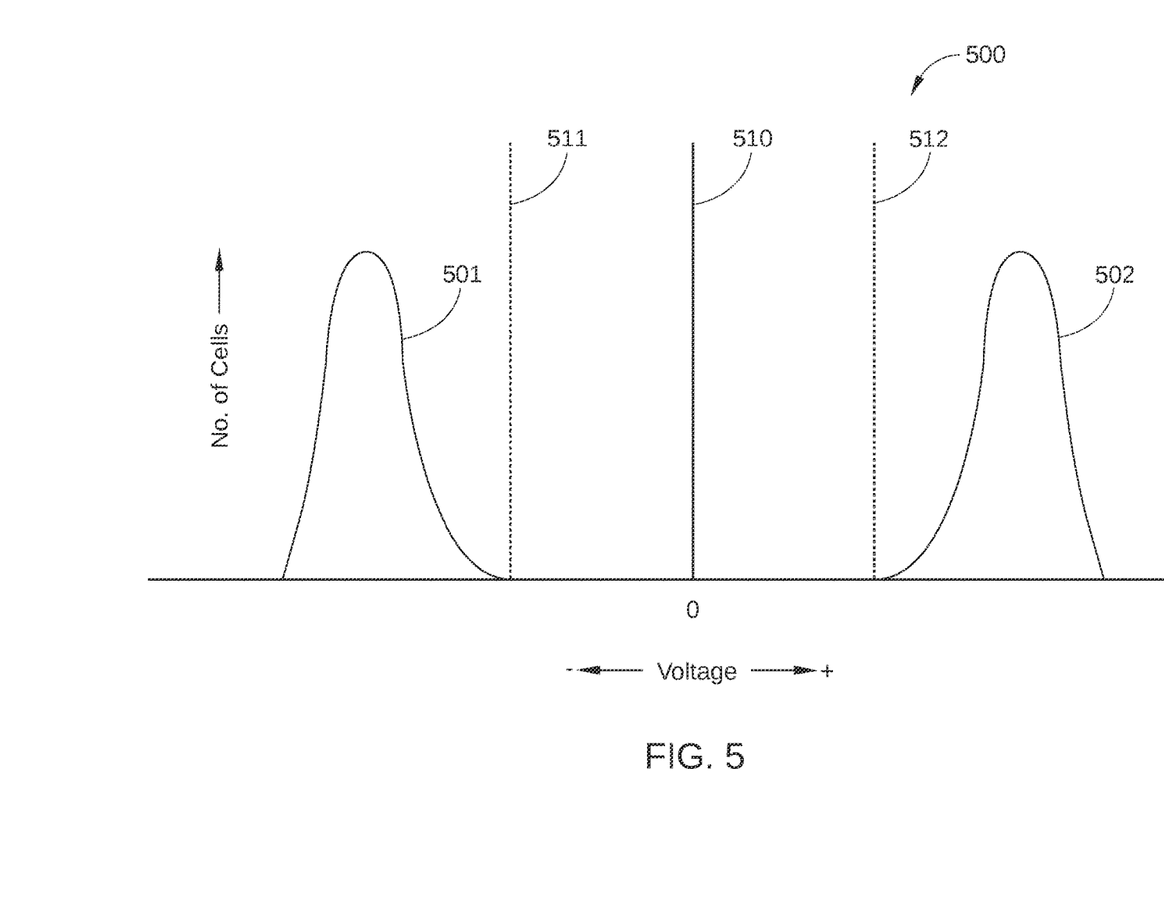
FIG. 5 is a graph illustrating a data distribution of voltage thresholds for a group of NAND memory cells shortly after being programmed with user data and/or test data, according to an embodiment.

FIG. 5 is a graph illustrating a data distribution 500 of threshold voltages for a group of NAND memory cells shortly after being programmed with user data 210 and/or test data 220, according to an embodiment. In FIG. 5, the abscissa represents threshold voltage of a NAND cell storing either user data 210 or test data 220, and the ordinate represents a number of cells that have a particular threshold voltage value. User data distribution 500 includes an erased-cell voltage distribution 501 disposed in the negative voltage region and a programmed-cell voltage distribution 502 disposed in the positive voltage region. In the embodiment illustrated in FIG. 5, user data 210 and test data 220 are both written to NAND memory cells using substantially the same write process at approximately the same time, and therefore have substantially the same distribution of voltage thresholds. In other embodiments, user data 210 are written with a different write process than test data 220, in which case user data 210 and test data 220 each have different data distribution associate therewith, as described above in conjunction with FIG. 4.

Also shown in FIG. 5 is a user data read threshold 510, a first test data threshold 511, and a second test data threshold 512. User data read threshold 510, which may be positioned at or near 0 volts, indicates a demarcation between a charge in a NAND memory cell being read as having a bit value of 0 or 1. Read errors in the NAND memory cells associated with data distribution 500 due to charge leakage generally do not occur until erased-cell voltage distribution 501 and/or programmed-cell voltage distribution 502 degrade sufficiently to cross user data threshold 510. However, in some embodiments, NAND memory cells storing test data 220 are read using first test data threshold 511 and second test data threshold 512. First test data threshold 511 and second test data threshold 512 are disposed closer than user data read threshold 510 to erased-cell voltage distribution 501 and programmed-cell voltage distribution 502, respectively. Consequently, reading test data 220 using first test data threshold 511 and second test data threshold 512 (rather than user data read threshold 510) can indicate data retention errors in test data 220 before user data 210 have degraded to the point at which data loss can occur.

In some embodiments, test data 220 are written using a modified write operation that is more robust relative to the write operation employed for reading user data 210. Then, by reading test data 220 with a modified read operation in which a relatively high minimum read voltage is employed, the onset of significant charge leakage can be detected more readily in a group of NAND memory cells storing test data 220 and user data 210 associated therewith. One such embodiment is illustrated in FIG. 6.

Figure 6:
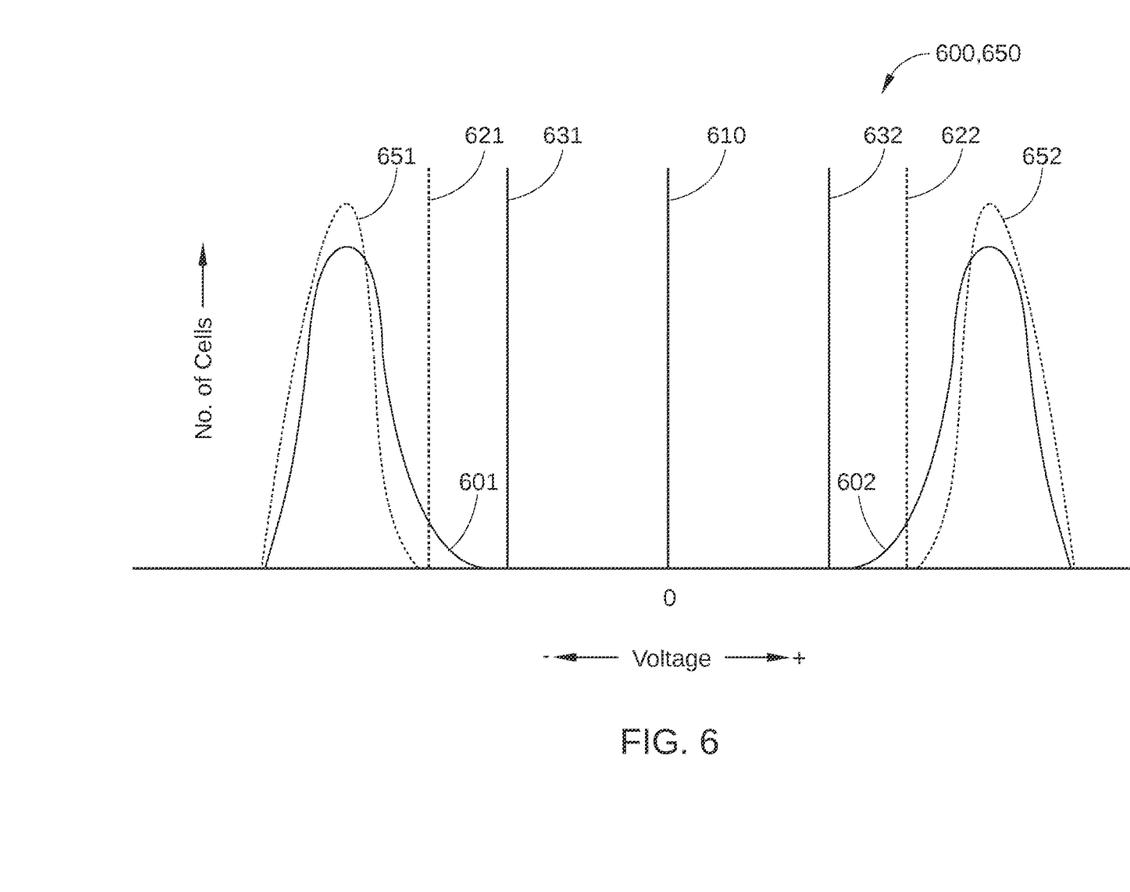
FIG. 6 is a graph illustrating a user data distribution of voltage thresholds for a group of NAND memory cells shortly after being programmed with user data and a test data distribution of voltage thresholds for a group of NAND memory cells shortly after being programmed with test data, according to an embodiment.

FIG. 6 is a graph illustrating a user data distribution 600 of voltage thresholds for a group of NAND memory cells shortly after being programmed with user data 210 and a test data distribution 650 (dashed curves) of voltage thresholds for a group of NAND memory cells shortly after being programmed with test data 220, according to an embodiment. In FIG. 6, the abscissa represents threshold voltage of a NAND cell storing either user data 210 or test data 220, and the ordinate represents a number of cells that have a particular threshold voltage value associated therewith. User data distribution 600 includes an erased-cell voltage distribution 601 disposed in the negative voltage region of initial distribution 300 and a programmed-cell voltage distribution 602 disposed in the positive voltage region of initial distribution 300, while test data distribution 650 includes a similarly disposed erased-cell voltage distribution 651 and programmed-cell voltage distribution 652.

In the NAND memory cells represented by test data distribution 650, i.e., cells programmed with test data 220, a modified write operation is used to write test data 220. Specifically, a program verify operation associated with writing test data 220 uses write verification threshold voltages 621 and 622 (dashed lines) that are higher (in absolute voltage) than the verification threshold voltages employed in a program verify operation associated with writing user data 210, i.e., verification threshold voltages 631 and 632, respectively. Because the verification threshold voltage of a program verify operation defines a minimum (absolute) charge or voltage required for a NAND memory cell to be verified as successfully programmed, there is a tighter charge distribution for test data 220 than for user data 210 when write verification threshold voltages 621 and 622 are employed. Thus, unlike user data 210, test data 220 has little or no "tail" associated therewith. Consequently, the number of read errors or ECC errors associated with reading test data 220 will generally increase suddenly as charge leakage continues over time in the NAND memory cells storing user data 210 and test data 220. It is noted that in order to detect such an increase in charge leakage in test data 220 before user data 210 degrades to the point of potentially being lost, in such embodiments test data 220 are generally read with a minimum (absolute) data read threshold that is significantly higher than the minimum (absolute) data read threshold employed in reading user data 210.

In some embodiments, test data 220 are written to a region of flash memory device 135 before the user data 210 associated therewith are written to the same region of flash memory device. Therefore, test data 220 are as old as or older than user data that are stored in the corresponding region, and more likely to indicate possible data retention failure before user data 210. For example, in some embodiments, the region of flash memory device 135 in which test data 220 and user data 210 are written includes a particular erasable memory block of flash memory device 135. One such embodiment is illustrated in FIGS. 7A-7D.

FIGS. 7A-7D schematically illustrate an erasable memory block 700 of flash memory device 135 at various times during operation, according to an embodiment. In some embodiments, erasable memory block 700 is a 1 megabyte (MB) block that is the smallest erasable data storage region of flash memory device 135. Thus, when configured as an 8 GB device, flash memory device 135 includes approximately 8,000 erasable memory blocks 700. Erasable memory block 700 may be configured with 32 pages 710, each configured to store 32 KB of user data 210, test data 220, and/or no data. Furthermore, user data 210 stored in any particular page 710 may be dirty data, non-dirty data, or invalid data (i.e., obsolete data, deleted data, and the like).

Figure 7A:
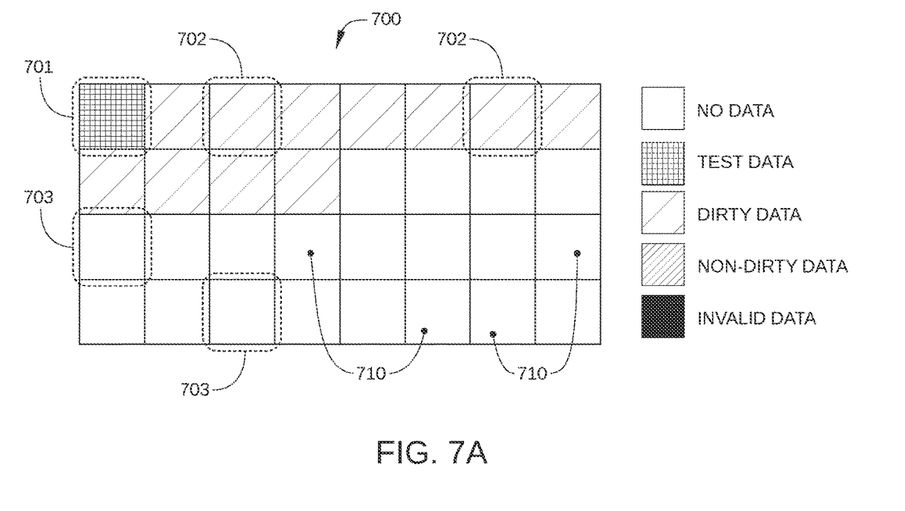
FIGS. 7A-7D schematically illustrate an erasable memory block of a flash memory device at various times during operation, according to an embodiment.

FIG. 7A illustrates erasable block 700 after user data 210 are initially stored therein. In some embodiments, when user data 210 are initially stored in erasable block 700, test data 220 are also stored in at least one page 710 of erasable block 700, for example test page 701. Subsequently, the quality of all data stored in erasable block 700 can be determined by reading test page 701 using one or more of the techniques described above. In some embodiments, test page 701 is the first page of erasable block 700, thereby insuring that test data 220 are at least as old as any of the user data 210 stored in erasable block 700. It is noted that when initially written to erasable block 700, user data 210 may be dirty data 702, since a copy of this data may not have yet been stored on storage disk 110 of hybrid HDD 100. Empty pages 703 store no data, and are therefore available for storing additional user data 210 at a later time.

Figure 7B:
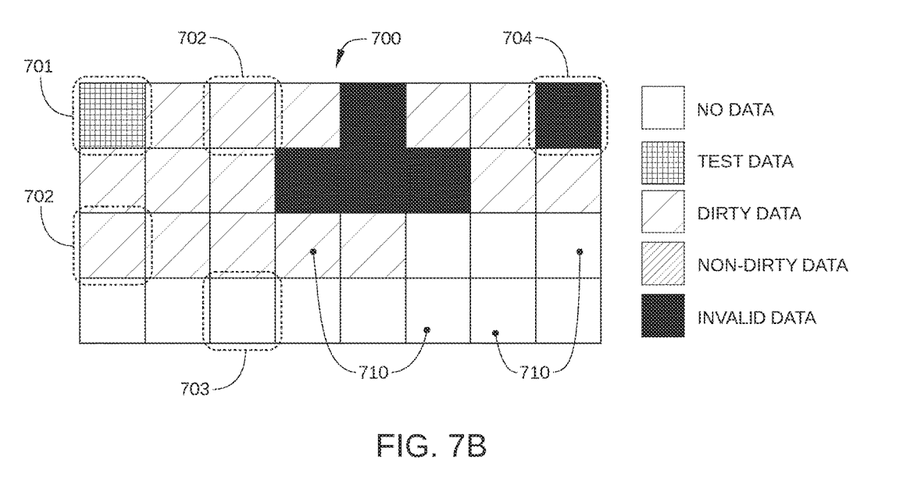

FIG. 7B illustrates erasable block 700 after further operation. As shown, additional user data 210 have been stored in additional pages as dirty data 702, and some pages 710 of erasable block 700 have been indicated to now store invalid data 704. Because none of the user data 210 currently stored in erasable block 700 have yet been copied to storage disk 110, all user data 210 that are valid are still dirty data. The quality of all dirty data stored in erasable block 700 can be determined periodically or at any other time by reading test page 701, so that data retention errors do not occur that result in loss of user data 210.

Figure 7C:
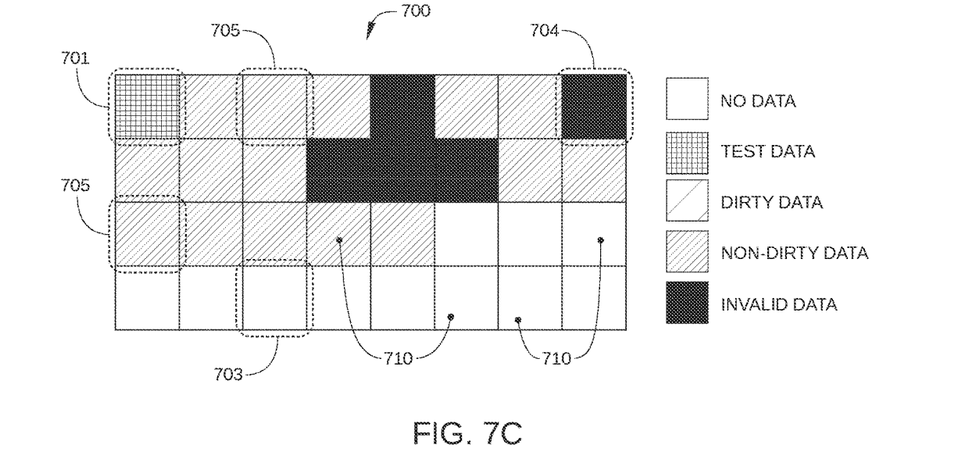

FIG. 7C illustrates erasable block 700 after still further operation, in which all dirty data stored in erasable block 700, and possibly in some or all other erasable blocks of flash memory device 135, are copied to storage disk 110. Thus, erasable block 700 now includes test data 220 (stored in test page 701), user data 220 (stored as non-dirty data 705), invalid data 704, and pages that are storing no data 703. In some embodiments, the quality of test data 220 in test page 701 of erasable block 700 is not tested when erasable block 700 includes no dirty data 702. In other embodiments, the quality of test page 701 of erasable block 700 is tested whenever erasable block 700 includes any user data 220 that is not invalid data 704.

Figure 7D:
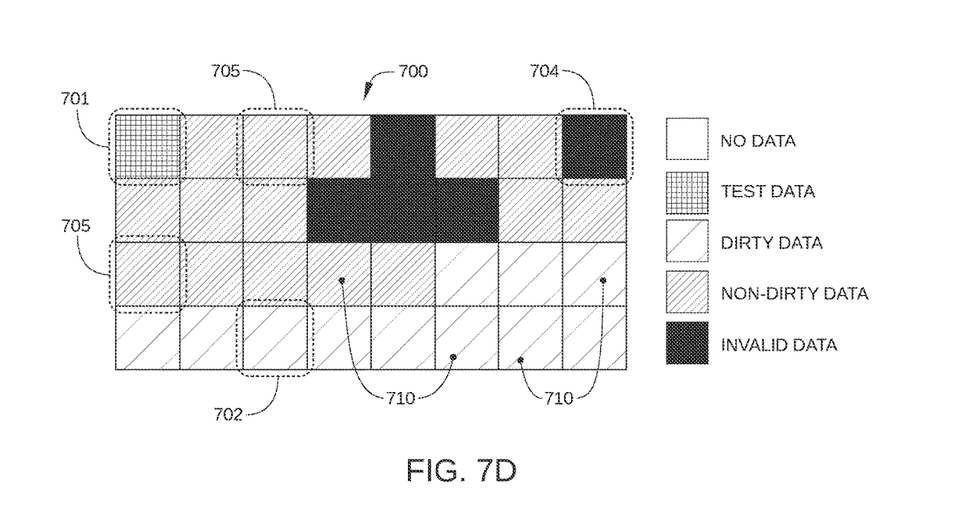

FIG. 7D illustrates erasable block 700 after still further operation, in which additional user data 220 are stored as dirty data 702 in erasable block 700. As shown, erasable block 700 has no empty pages and can store no additional user data 220. Test page 701 can be read at any time to ensure that the user data 220 stored in erasable block 700 is not in danger of data loss due to charge leakage. Eventually, as more of pages 710 store invalid data, or when reading of test page 701 indicates that data retention errors may begin to occur, dirty data 702 (and in some embodiments non-dirty data 705) are stored in a different location in flash memory device 135, and erasable block 700 is indicated to be available for reuse. In some embodiments, the remaining data of erasable block 700 may be stored in a different erasable block, for example as part of a garbage collection operation, and/or on storage disk 110. In some embodiments, erasable block 700 is indicated to be available for reuse by being erased. In other embodiments, erasable block 700 is indicated to be available for reuse with a flag or other indicator, but is not erased until immediately before being programmed with new user data 210 and test data 220.

In some embodiments, a test page may be associated with a larger region of flash memory device 135 than a single erasable memory block, as illustrated in FIGS. 7A-7D. For example, in one such embodiment, the larger region may include a so-called "superblock" of flash memory device 135, which may include a single erasable block from each of a plurality of memory chips or dies of flash memory device 135. One embodiment of a superblock is illustrated in FIG. 8.

Figure 8:
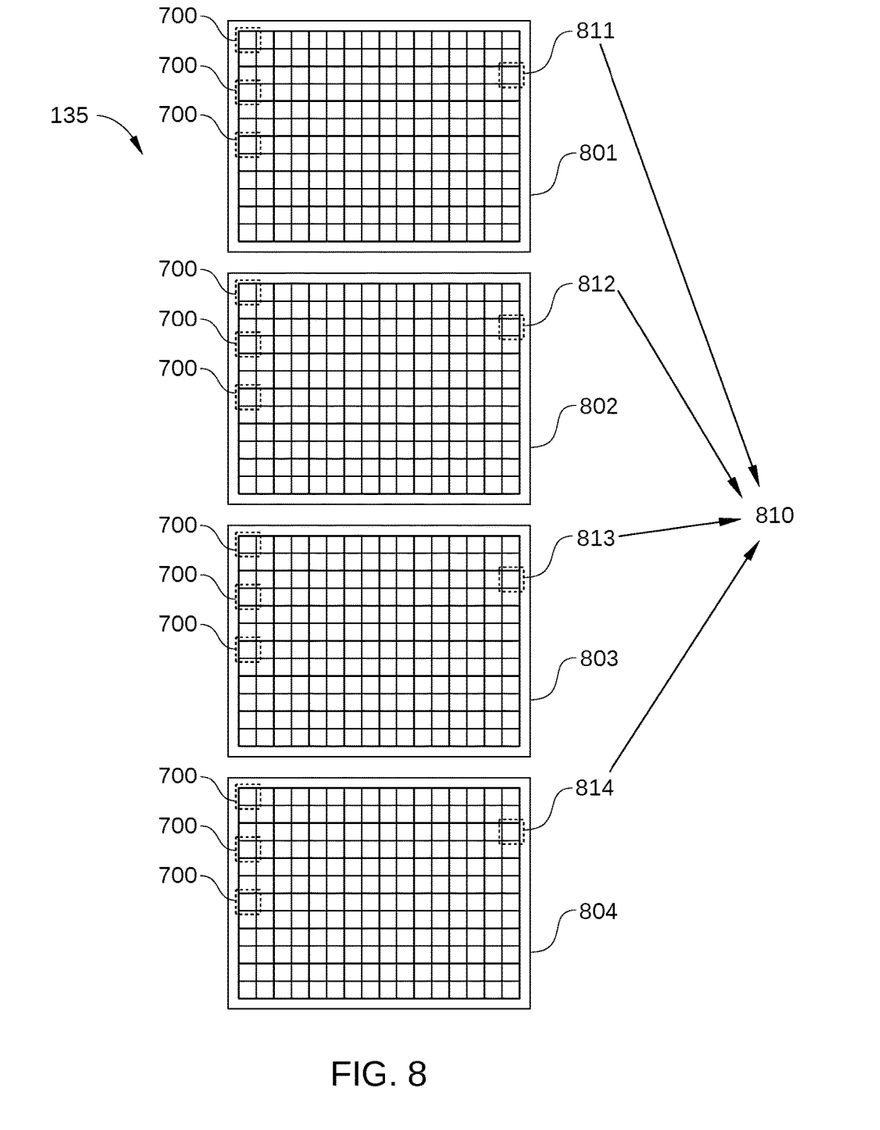
FIG. 8 is a schematic view of a flash memory device, according to an embodiment.

FIG. 8 is a schematic view of flash memory device 135, according to an embodiment. As shown, flash memory device 135 may include multiple integrated circuit dies 801-804. For example, each of integrated circuit dies 801-804 may be a 1 GB NAND flash die that includes a plurality of erasable memory blocks 700. In some embodiments, a superblock 810 of flash memory device 135 includes a single erasable block 700 from each of integrated circuit dies 801-804. For example, superblock 810 may include erasable block 811 from integrated circuit die 801, erasable block 812 from integrated circuit die 802, erasable block 813 from integrated circuit die 803, and erasable block 814 from integrated circuit die 804. In some embodiments, a single test page similar to test page 701 in FIG. 7 may be associated with each superblock of flash memory device 135. In other embodiments, a single test page may be associated with multiple superblocks of flash memory device 135.

Figure 9:
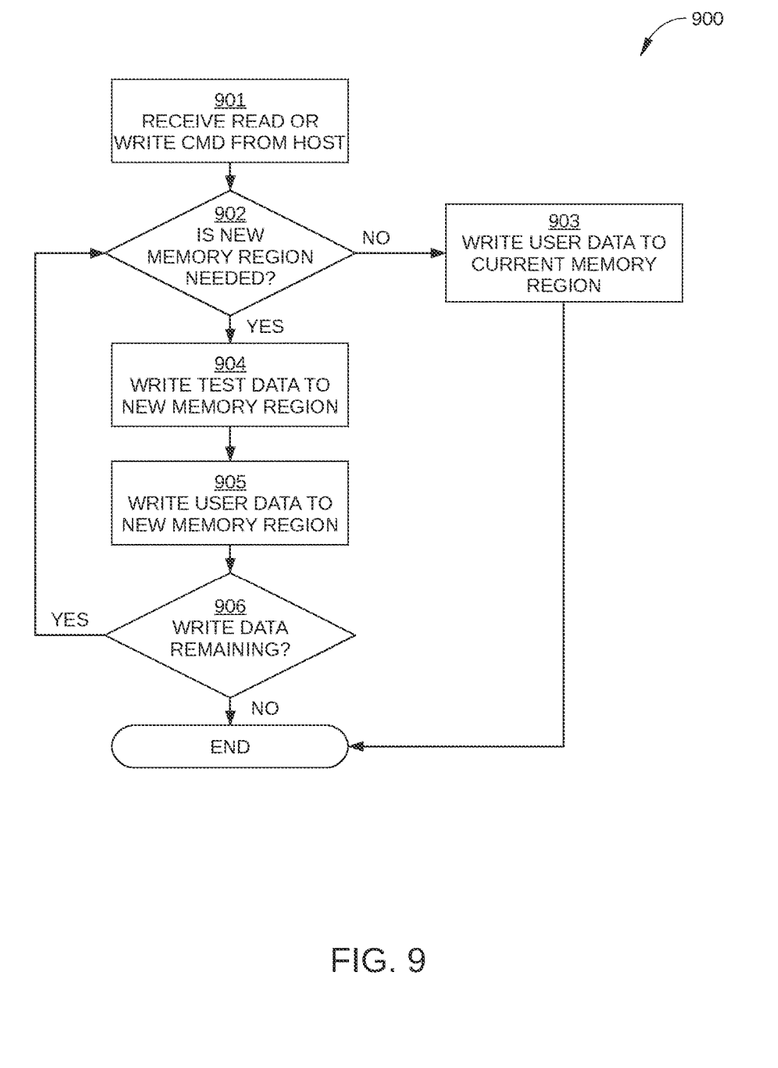
FIG. 9 sets forth a flowchart of method steps for storing data in a data storage device, such as the hybrid HDD in FIG. 1, according to an embodiment.

FIG. 9 sets forth a flowchart of method steps for storing data in a data storage device, such as hybrid HDD 100, according to one or more embodiments. Although the method steps are described in conjunction with hybrid HDD 100 in FIGS. 1-8, persons skilled in the art will understand that the method steps may be performed with any other data storage device that includes a nonvolatile solid-state data storage device, such as a solid-state drive. The control algorithms for the method steps may reside in and/or be performed by controller 133, flash manager device 136, and/or any other suitable control circuit or system.

As shown, method 900 begins at step 901, where microprocessor-based controller 133 or other suitable control circuit or system receives a write command and data associated with the write command, i.e., write data, from host 10. Alternatively, in some embodiments, method 900 begins in step 901 when microprocessor-based controller 133 receives a read command from host 10. In such embodiments, data read from storage disk 110 in response to the read command are stored in flash memory device 135 as described below.

In step 902, microprocessor-based controller 133 determines whether a new erasable memory region of flash memory device 135 is needed to store the write data received in step 901 or the read data read from storage disk 110 in step 901. For example, when the quantity of write data received in step 901 exceeds the remaining storage capacity of a current memory region that already stores user data 210 and test data 220, a new erasable memory region of flash memory device 135 is needed. In some embodiments, the memory region is an erasable memory block, such as erasable memory block 700 in FIG. 7. In other embodiments, the region is a superblock or other region associated with a single set of test data 220. If a new erasable memory region is not needed, method 900 proceeds to step 903; if a new erasable memory region is needed, method 900 proceeds to step 904. In step 903, microprocessor-based controller 133 causes the write data received in step 901 to be written to the currently used erasable memory region, i.e., a region that already stores test data 220, and method 900 ends.

In step 904, microprocessor-based controller 133 writes test data 220 to a new erasable memory region of flash memory device 136. For example, when the new erasable memory region is an erasable block or superblock of flash memory device 135, test data 220 may be written in a particular test page, such as the first page of the erasable block or superblock.

In step 905, microprocessor-based controller 133 causes at least a portion of the write data received in step 901 (or read data read in step 901) to be written in the new erasable memory region, such as one page of data. In step 906, microprocessor-based controller 133 determines whether any of the write data received in step 901 (or read data read in step 901) remains to be written in flash memory device 135. If yes, method 900 proceeds back to step 905; if no, method 900 ends.

Thus, in response to receiving a write command (or read command) from host 10, hybrid HDD 100 stores test data 220 in each memory region in which user data 210 associated with the write command (or read command) are stored. In some embodiments, test data 220 in each such memory region can be subsequently tested to ensure that user data 210 have not degraded to a point at which data loss can occur. One such embodiment is described below in conjunction with FIG. 10.

Figure 10:
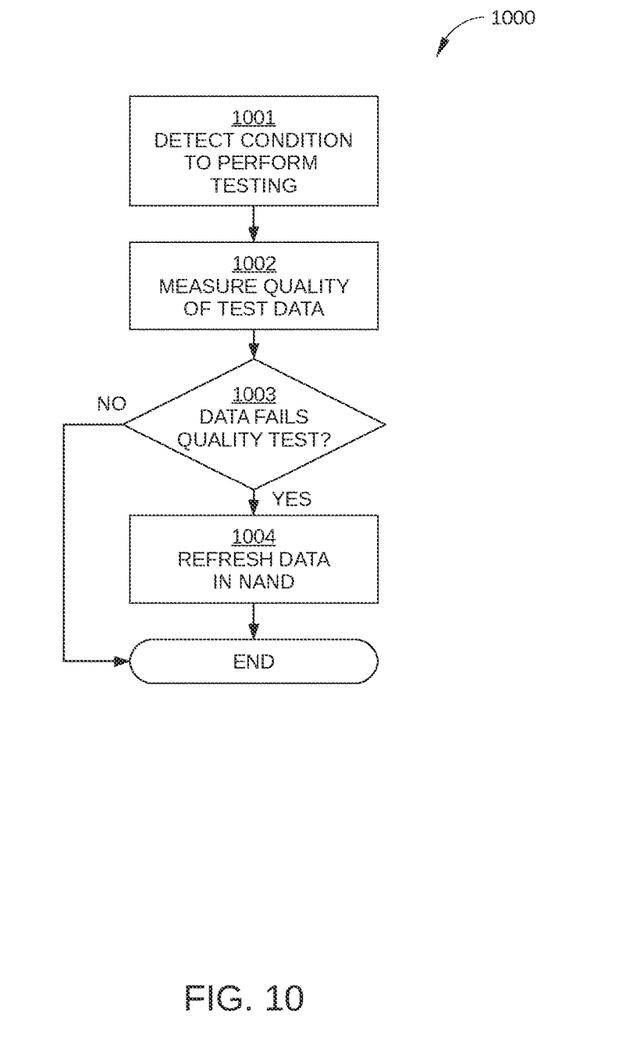
FIG. 10 sets forth a flowchart of method steps for refreshing data in a non-volatile solid-state device, such as the flash memory device in FIG. 3, according to an embodiment For clarity, identical reference numbers have been used, where applicable, to designate identical elements that are common between figures. It is contemplated that features of one embodiment may be incorporated in other embodiments without further recitation.

FIG. 10 sets forth a flowchart of method steps for refreshing data in a non-volatile solid-state device, such as flash memory device 135, according to an embodiment. Although the method steps are described in conjunction with hybrid HDD 100 in FIGS. 1-8, persons skilled in the art will understand that the method steps may be performed with any other data storage device that includes a nonvolatile solid-state data storage device, such as a solid-state drive. The control algorithms for the method steps may reside in and/or be performed by controller 133, flash manager device 136, and/or any other suitable control circuit or system.

As shown, method 1000 begins at step 1001, where microprocessor-based controller 133 or other suitable control circuit or system detects a condition to perform a test of data quality in one more erasable memory regions of flash memory device 135. Suitable conditions for initiating such testing include powering on of flash memory device 135 and/or hybrid HDD; expiration of a predetermined time interval, either in absolute time provided by host 10 or in operating time tracked by microprocessor-based controller 133; detection of a number of program/erase cycles that exceeds a predetermined value, either for a particular erasable memory region or for flash memory device as a whole; and detection of a number of read errors associated with data stored in a particular erasable memory region or regions that exceeds a predetermined maximum value. Thus the condition to perform the test of data quality may be based on a specific region (e.g., an erasable block or superblock), or on flash memory device 135 as a whole. Alternatively or additionally, in some embodiments, the condition for initiating the test of data quality may be received from host 10.

In step 1002, microprocessor-based controller 133 measures the quality of test data 220 for each memory region to be tested. For example, upon startup of hybrid HDD 100, the quality of test data 220 in each memory region that stores an instance of test data 220 may be tested. In other situations, the quality of individual memory regions may be tested, such as when a maximum number of read errors is exceeded for a particular memory region. In some embodiments, the quality of test data is measured by reading test data 220 associated with a particular memory region using a read threshold that is selected to increase a likelihood of read errors occurring. In some embodiments, a number of ECC (error-correction code) errors or any other bit errors are tracked as a result of such a reading of test data 220.

In step 1003, microprocessor-based controller 133 determines whether the quality of test data 220 exceeds a threshold, such as a maximum allowable number of bit errors. If no, method 1000 ends; if yes, method 1000 proceeds to step 1004.

In step 1004, microprocessor-based controller 133 causes user data 210 to be refreshed. In some embodiments, the user data to be refreshed is only user data 210 associated with the test data 220 that failed in step 1003, such as user data 210 stored in a particular memory region of flash memory device 135 (e.g., a single erasable memory block). In other embodiments, all user data 210 in flash memory device 135 is refreshed that is currently dirty data. In some embodiments, user data 210 are refreshed in step 1004 by being written to a different erasable memory region in flash memory device 135. Alternatively or additionally, user data 210 are refreshed in step 1004 by being stored on storage disk 110. In some embodiments, user data 210 may be refreshed indirectly via garbage collection. Specifically, user data 210 stored in a particular memory region of flash memory device 135 may be refreshed by the designation of the particular memory region as a memory region to undergo a garbage collection operation, either immediately or during the next garbage collection operation that is performed in flash memory device 135. The priority of garbage collection (relative to other housekeeping tasks that the storage device might be doing, or relative to responding to subsequent host commands) might be increased, if the dirty user data is in imminent danger of being lost.

In sum, embodiments described herein provide systems and methods for refreshing data in a hybrid HDD or other device that includes a nonvolatile solid-state device. The hybrid HDD writes test data in a region of the nonvolatile solid-state device when user data are stored in the nonvolatile solid-state device. The test data are subsequently read to detect the possibility of data retention errors that may occur when reading the associated user data. Furthermore, to increase sensitivity to incipient charge leakage that may compromise the user data, the test data may be written using a modified write process and/or read with a modified read operation.

While the foregoing is directed to embodiments of the present invention, other and further embodiments of the invention may be devised without departing from the basic scope thereof, and the scope thereof is determined by the claims that follow.

We claim:

1. A method of refreshing data in a non-volatile solid-state device divided into a plurality of regions including a first region that has written therein first test data and first user data and a second region that has written therein second test data and second user data, the method comprising:
   detecting a condition to perform testing;
   in response to detecting the condition, measuring a quality of the first test data and a quality of the second test data;
   determining that the quality of the first test data exceeds a threshold and the quality of the second test data is below the threshold;
   in response to the quality of the first test data exceeding the threshold, maintaining the first user data in the first block;
   in response to the quality of the second test data being below the threshold, rewriting the second user data in a third region of the non-volatile solid-state device; and
   after rewriting the second user data in the third region, indicating that the second region is available for reuse.

2. The method of claim 1, wherein the non-volatile solid-state device is a hybrid HDD device.

3. The method of claim 2, wherein measuring the quality of the first test data comprises reading the first test data using a read threshold that is selected to increase a likelihood of read errors occurring.

4. The method of claim 2, wherein measuring the quality of the first test data comprises:
reading the first test data; and
tracking a number of bit errors associated with reading the first test data.

5. The method of claim 1, wherein
the first test data include a predetermined data test pattern that is written in the first region with a first write programming voltage, and
the first user data are written in the first region with a second write programming voltage that is greater than the first write threshold voltage.

6. The method of claim 1, wherein
the first test data include a predetermined data test pattern that is written in the first region with a write operation that uses a first write period, and
the first user data are written in the first region with a write operation that uses a second write period that is longer than the first write period.

7. The method of claim 1, wherein the test data includes a predetermined data test pattern or user data, or a combination of both.

8. A non-volatile solid-state device, comprising:
a plurality of data storage regions including a first region that has written therein first test data and first user data and a second region that has written therein second test data and second user data; and
a controller configured to:
detect a condition to perform testing;
in response to detecting the condition, measure a quality of the first test data and a quality of the second test data;
determine that the quality of the first test data exceeds a threshold and the quality of the second test data is below the threshold;
in response to the quality of the first test data exceeding the threshold, maintain the first user data in the first block;
in response to the quality of the second test data being below the threshold, rewrite the second user data in a third region of the non-volatile solid-state device; and
after rewriting the second user data in the third region, indicate that the second region is available for reuse.

9. The non-volatile solid-state device of claim 8, wherein the first region comprises a first erasable block of the non-volatile solid-state device and the second region comprises a second erasable block of the non-volatile solid-state device.

10. The non-volatile solid-state device of claim 9, wherein the first test data are written in a first page of the first erasable block.

11. The non-volatile solid-state device of claim 9, wherein the first test data are written in the first region before the first user data are written in the first region.

12. The non-volatile solid-state device of claim 8, wherein the first region comprises a single erasable block from each of a plurality of memory dies of the non-volatile solid-state device, and the second region comprises a single erasable block from each of the plurality of memory dies.

13. The non-volatile solid-state device of claim 8, wherein the non-volatile solid-state device is a hybrid HDD device.

14. The non-volatile solid-state device of claim 13, wherein the controller is configured to measure the quality of the first test data by reading the first test data using a read threshold that is selected to increase a likelihood of read errors occurring.

15. The non-volatile solid-state device of claim 13, wherein the condition for initiating testing comprises one of powering on of the non-volatile solid-state device, expiration of a predetermined time interval, detection of a number of program/erase cycles that exceeds a predetermined value, and detection of a number of read errors associated with data stored in the first region or the second region that exceeds a predetermined maximum value.

16. The non-volatile solid-state device of claim 13, wherein the controller is configured to measure the quality of the first test data by:
reading the first test data; and
tracking a number of bit errors associated with reading the first test data.

17. The non-volatile solid-state device of claim 8, wherein
the first test data include a predetermined data test pattern that is written in the first region with a first write threshold voltage, and
the first user data are written in the first region with a second write threshold voltage that is greater than the first write threshold voltage.

18. The non-volatile solid-state device of claim 8, wherein
the first test data include a predetermined data test pattern that is written in the first region with a write operation that uses a first write period, and
the first user data are written in the first region with a write operation that uses a second write period that is longer than the first write period.

19. The non-volatile solid-state device of claim 8, wherein
a program verify operation associated with writing the first test data in the first region uses a first verification threshold voltage, and
a program verify operation associated with writing the user data in the first region uses a second verification threshold voltage that is lower than the first verification threshold.

20. The non-volatile solid-state device of claim 8, wherein the test data includes a predetermined data test pattern or user data, or a combination of both.

21. The non-volatile solid-state device of claim 8, the controller is further configured to store the second user data on a magnetic storage device associated with the non-volatile solid-state device.

22. The non-volatile solid-state device of claim 8, wherein rewriting the second user data in the third region comprises writing the second user data in the third region as part of a garbage collection operation.

* * * * *